United States Patent
Noguchi et al.

(10) Patent No.: US 7,075,047 B2
(45) Date of Patent: Jul. 11, 2006

(54) TEMPERATURE CONTROL APPARATUS

(75) Inventors: Nobuaki Noguchi, Saijo (JP); Yasushi Ueda, Saijo (JP); Toru Aoki, Saijo (JP); Makoto Okazaki, Niihama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/076,230

(22) Filed: Mar. 10, 2005

(65) Prior Publication Data

US 2005/0199779 A1 Sep. 15, 2005

(30) Foreign Application Priority Data

Mar. 10, 2004 (JP) .............................. 2004-066897

(51) Int. Cl.
*G01J 1/32* (2006.01)
*H01S 3/04* (2006.01)

(52) U.S. Cl. ..................... 250/205; 372/34; 372/38.01

(58) Field of Classification Search ................ 250/205, 250/238; 372/38.01, 38.02, 34
See application file for complete search history.

(56) References Cited

U.S. PATENT DOCUMENTS 5,499,258 A  3/1996  Kawano et al. ............... 372/34

6,229,833 B1 * 5/2001 Noda et al. ............... 372/38.09

FOREIGN PATENT DOCUMENTS

JP           07022678      1/1995
JP           7-321392      12/1995

* cited by examiner

*Primary Examiner*—Thanh X. Luu
(74) *Attorney, Agent, or Firm*—Wenderoth, Lind & Ponack, L.L.P.

(57) ABSTRACT

A temperature control apparatus comprises a light-emitting device, a light-emitting device controller, a Peltier device for controlling the temperature of the light-emitting device to a target temperature, a temperature detector for the light-emitting device, a first reference voltage holding unit for holding a voltage corresponding to the target temperature, a reference voltage controller for outputting a holding signal and a switching signal, a second reference voltage holding unit for holding the output voltage of the temperature detector on the basis of the holding signal, a reference voltage switching unit for selecting either the output of the first reference voltage holding unit or the output of the second reference voltage holding unit as a reference voltage, and a Peltier controller for controlling the Peltier device so as to minimize a difference between the output voltage of the temperature detector and the output voltage of the reference voltage switching unit.

14 Claims, 5 Drawing Sheets

TEMPERATURE CONTROL APPARATUS

FIELD OF THE INVENTION

The present invention relates to a temperature control apparatus for a light-emitting device such as a fluorescent microscope, a semiconductor exposure device, an optical characteristic evaluation device, or the like. More specifically, the invention relates to a technique of temperature control for maintaining stabilities of luminous wavelength and intensity of a light-emitting device.

BACKGROUND OF THE INVENTION

Conventionally, a laser diode or a light-emitting diode has commonly been used as a pumping light source of a fluorescent microscope or a light source of a semiconductor exposure device or an optical characteristic evaluation device, because of its small size and low power consumption.

However, the laser diode and the light-emitting diode have temperature dependence, and their luminance wavelengths and intensities vary with variations in temperature. Therefore, there is proposed a temperature control apparatus comprising a heating/cooling means such as a Peltier device and a temperature detection means such as a thermistor, and controlling a light-emitting device (laser diode or light-emitting diode) to keep the temperature thereof constant (for example, Japanese Published Patent Application No. Hei. 7-22678).

FIG. 5 is a block diagram illustrating conventional temperature control apparatus.

The temperature control apparatus shown in FIG. 5 comprises a light-emitting device 500, a photodetector 501 for outputting a light intensity signal of the light-emitting device 500, a light-emitting device controller 502 for outputting an optical output control signal for controlling an optical output from the light-emitting device 500 on the basis of the light intensity signal, a Peltier device 503 for setting the temperature of the light-emitting device 500 to a predetermined target temperature, a temperature detector 504 for detecting the temperature of the light-emitting device 500, a reference voltage holding unit 507 for holding an output voltage of the temperature detector 504 corresponding to the target temperature, a difference amplifier 508 for amplifying a difference between the output voltage of the temperature detector 504 and the output voltage of the reference voltage holding unit 507, and a Peltier to controller 509 for controlling the Peltier device 503 according the output of the difference amplifier 508.

The difference amplifier 508 is implemented by a differential amplifier circuit using an operational amplifier.

Further, the temperature detector 504 comprises a resistor 505 and a thermistor 506 which are connected in series between the power supply and the ground.

The thermistor 506 is a device whose resistance value varies with variations in temperature. When a thermistor having a B constant of 3380±1% and a resistance value of 10K±1% Ω at 25[° C.], and a resistor of 10KΩ are connected in series between a 5V power supply and the ground, the output voltage of the temperature detector 504 varies as shown in table 1. The output voltage becomes 2.5[V] at 25[° C.], and decreases by about 40 [mV] as the temperature increases by 1° C.

TABLE 1

| temperature of light-emitting device [° C.] | output voltage of temperature detector [V] |
| --- | --- |
| 10 | 3.2 |
| 20 | 2.7 |
| 25 | 2.5 |
| 30 | 2.3 |
| 40 | 1.8 |
| 50 | 1.5 |
| 60 | 1.2 |

For example, since the light-emitting device 500 can be controlled to 25[° C.] by keeping the output voltage of the temperature detector 504 at 2.5[V], a controller (not shown) of the whole system including the temperature controller sets a reference voltage at 2.5[V] on the reference voltage holding unit 507. When making the light-emitting device 500 emit light, a current supplied to the light-emitting device 500 cannot be converted into optical energy by 100%, and the electric energy that has not been converted into optical energy becomes thermal energy. At this time, since the temperature of the light-emitting device 500 increases and thereby the output voltage of the temperature detector 504 decreases, a difference between the output voltage of the temperature detector 504 and the output voltage of the reference voltage holding unit 507 is amplified by the difference amplifier 508, and the Peltier controller 509 applies a driving current to the Peltier device 503 on the basis of the amplified difference voltage so as to cool the light-emitting device 500. The above-mentioned operation enables the temperature of the light-emitting device 500 to be kept at 25[° C.].

On the other hand, when the temperature surrounding the light-emitting device 500 decreases and thereby the temperature of the light-emitting device 500 decreases, the output voltage of the temperature detector 504 increases. Therefore, the Peltier controller 509 applies a driving current to the Peltier device 503 so as to heat the light-emitting device 500, whereby the temperature of the light-emitting device 500 can be kept at 25[° C.].

Further, there is proposed another temperature control apparatus which is obtained by providing the above-mentioned temperature control apparatus with a means for feeding a voltage corresponding to the driving current applied to the Peltier device back to the input of the difference amplifier to add the voltage to the output voltage of the temperature detector (for example, Japanese Published Patent Application No. Hei. 7-321392). This temperature control apparatus can stabilize temperature control when the temperature changes between cooling and heating, and minimize temperature fluctuations in the critical value of the driving current applied to the Peltier device.

In the conventional temperature control apparatus, however, when the light-emitting device emits light or is quenched, the current flowing in the light-emitting device varies and thereby the ground voltage varies. Therefore, even though the temperature of the light-emitting device does not change actually, the output voltage of the temperature detector varies, whereby the Peltier controller changes the temperature of the light-emitting device to a temperature different from the desired temperature.

Further, if the temperature detector and the light-emitting device share a power supply, the current flowing in the light-emitting device varies when the light-emitting device emits light or is quenched and thereby the power supply voltage varies. Therefore, even though the temperature of the light-emitting device does not change actually, the output voltage of the temperature detector varies, whereby the Peltier controller changes the temperature of the light-emitting device to a temperature different from the desired temperature.

Particularly, it becomes very difficult to realize stable power supply and grounding because of an increase in the driving current of the light-emitting device with an increase in the output power of the light-emitting device in recent years, and a reduction in the size of the light-emitting device module including the temperature detector.

Moreover, when the light-emitting device deteriorates with time, the current value for keeping the same light intensity gradually increases, whereby variations in the power supply voltage or the ground voltage gradually increase.

SUMMARY OF THE INVENTION

The present invention is made to solve the above-described problems and has for its object to provide a temperature control apparatus for controlling the temperature of a light-emitting device to a predetermined temperature with stability even when a power supply voltage or a ground voltage varies when controlling the temperature of the light-emitting device.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a temperature control apparatus comprising: a light-emitting device; a light-emitting device controller for outputting an optical output control signal for controlling the optical output of the light-emitting device; a heating/cooling unit for controlling the temperature of the light-emitting device to a predetermined target temperature; a temperature detector for detecting the temperature of the light-emitting device, converting the result of detection into a voltage, and outputting the voltage; a first reference voltage holding unit for previously holding an output voltage of the temperature detector corresponding to the target temperature; a reference voltage controller for generating a holding signal and a switching signal on the basis of tie optical output control signal, and outputting these signals; a second reference voltage holding unit for holding the output voltage of the temperature detector oil the basis of the holding signal; a reference voltage switching unit for selecting, on the basis of the switching signal, either the output voltage of the first reference voltage holding unit or the output voltage of the second reference voltage holding unit, and outputting the selected voltage as a reference voltage; and a heating/cooling controller for generating a control current on the basis of a difference between the output voltage of the temperature detector and the reference voltage outputted from the reference voltage switching unit to control the heating/cooling unit; wherein the reference voltage controller controls the reference voltage switching unit with the switching signal to make the switching unit select the output voltage of the first reference voltage holding unit as the reference voltage when the light-emitting device is quenched, and controls the reference voltage switching unit with the switching signal to make the switching unit select the output voltage of the temperature detector which is held by the second reference voltage holding unit on the basis of the holding signal, as the reference voltage, when the light-emitting device emits light.

According to a second aspect of the present invention, in the temperature control apparatus according to the first aspect, the temperature detector comprises a resistor and a thermistor whose resistance value varies with temperature variations, which are connected in series between different two reference voltages, and the output voltage of the temperature detector varies as the resistance value of the thermistor varies.

According to a third aspect of the present invention, in the temperature control apparatus according to the first aspect, the holding signal is a signal for instructing the second reference voltage holding unit to hold the output voltage of the temperature detector when the light-emitting device changes from the quenching state to the light-emitting state.

According to a fourth aspect of the present invention, in the temperature control apparatus according to the first aspect, the switching signal is a signal for instructing the reference voltage switching unit to select the output voltage of the first reference voltage holding unit as the reference voltage while the light-emitting device is quenched, and select the output voltage of the second reference voltage holding unit as the reference voltage while the light-emitting device emits light.

According to a fifth aspect of the present invention, in the temperature control apparatus according to the first aspect, the reference voltage controller comprises: a holding control unit for judging whether the light-emitting device emits light or is quenched on the basis of the optical output control signal, and outputting the holding signal for making the second reference voltage holding unit hold the output voltage of the temperature detector when it is judged that the light-emitting device emits light; and a reference voltage switching control unit for judging whether the light-emitting device emits light or is quenched on the basis of the optical output control signal, and changes the logic level of the switching signal so as to make the reference voltage switching unit select the output voltage of the second reference voltage holding unit as the reference voltage when it is judged that the light-emitting device emits light and the holding control unit outputs the holding signal, and changes the logic level of the switching signal so as to make the reference voltage switching unit select the output voltage of the first reference voltage holding unit as the reference voltage when it is judged that the light-emitting device is quenched.

According to a sixth aspect of the present invention, in the temperature control apparatus according to the fifth aspect, the holding control unit judges that the light-emitting device emits light, when it detects a rising edge of the optical output control signal.

According to a seventh aspect of the present invention, in the temperature control apparatus according to the fifth aspect, the reference voltage switching control unit judges that the light-emitting device emits light when it detects a rising edge of the optical output control signal, and judges that the light-emitting device is quenched when it detects a falling edge of the optical output control signal.

According to an eighth aspect of the present invention, there is provided a temperature control apparatus comprising: a light-emitting device; a photodetector for outputting a light intensity signal indicating the light intensity of the light-emitting device; a light-emitting device controller for outputting an optical output control signal for controlling the optical output of the light-emitting device on the basis of the light intensity signal; a heating/cooling unit for controlling the temperature of the light-emitting device to a predetermined target temperature; a temperature detector for detecting the temperature of the light-emitting device, converting the result of detection into a voltage, and outputting the voltage; a first reference voltage holding unit for previously holding an output voltage of the temperature detector corresponding to the target temperature; a reference voltage controller for generating a holding signal and a switching signal on the basis of the light intensity signal, and outputting these signals; a second reference voltage holding unit for holding the output voltage of the temperature detector on the basis of the holding signal; a reference voltage switching unit for selecting, on the basis of the switching signal, either the output voltage of the first reference voltage holding unit or the output voltage of the second reference voltage holding unit, and outputting the selected voltage as a reference voltage; and a heating/cooling controller for generating a control current on the basis of a difference between the output voltage of the temperature detector and the reference voltage outputted from the reference voltage switching unit to control the heating/cooling unit; wherein the reference voltage controller controls the reference voltage switching unit with the switching signal to make the switching unit select the output voltage of the first reference voltage holding unit as the reference voltage when the light-emitting device is quenched, and controls the reference voltage switching unit with the switching signal to make the switching unit select the output voltage of the temperature detector which is held by the second reference voltage holding unit on the basis of the holding signal, as the reference voltage, when the light-emitting device emits light.

According to a ninth aspect of the present invention, in the temperature control apparatus according to the eighth aspect, the temperature detector comprises a resistor and a thermistor whose resistance value varies with temperature variations, which are connected in series between different two reference voltages, and the output voltage of the temperature detector varies as the resistance value of the thermistor varies.

According to a tenth aspect of the present invention, in the temperature control apparatus according to the eighth aspect, the holding signal is a signal for instructing the second reference voltage holding unit to hold the output voltage of the temperature detector when the light-emitting device changes from the quenching state to the light-emitting state.

According to an eleventh aspect of the present invention, in the temperature control apparatus according to the eighth aspect, the switching signal is a signal for instructing the reference voltage switching unit to select the output voltage of the first reference voltage holding unit as the reference voltage while the light-emitting device is quenched, and select the output voltage of the second reference voltage holding unit as the reference voltage while the light-emitting device emits light.

According to a twelfth aspect of the present invention, in the temperature control apparatus according to the eighth aspect, the reference voltage controller comprises: a holding control unit for judging whether the light-emitting device emits light or is quenched on the basis of the light intensity signal, and outputting a holding signal for making the second reference voltage holding unit hold the output voltage of the temperature detector when it is judged that the light-emitting device emits light; and a reference voltage switching control unit for judging whether the light-emitting device emits light or is quenched on the basis of the light intensity signal, and changes the logic level of the switching signal so as to make the reference voltage switching unit select the output voltage of the second reference voltage holding unit as the reference voltage when it is judged that the light-emitting device emits light and the holding control unit outputs the holding signal, and changes the logic level of the switching signal so as to make the reference voltage switching unit select the output voltage of the first reference voltage holding unit as the reference voltage when it is judged that the light-emitting device is quenched.

According to a thirteenth aspect of the present invention, in the temperature control apparatus according to the twelfth aspect, the holding control unit judges that the light-emitting device emits light, when it detects a rising edge of the light intensity signal.

According to a fourteenth aspect of the present invention, in the temperature control apparatus according to the twelfth aspect, the reference voltage switching control unit judges that the light-emitting device emits light when it detects a rising edge of the light intensity signal, and judges that the light-emitting device is quenched when it detects a falling edge of the light intensity signal.

According to the present invention, when the light-emitting device emits light, the output voltage of the temperature detector immediately after the power supply voltage or the ground voltage fluctuates is held, and the held output voltage is used as a reference voltage of the difference amplifier. Therefore, even if the power supply voltage or the ground voltage fluctuates when the light-emitting device emits light, the temperature of the light-emitting device can be controlled to a desired temperature with stability.

DETAILED DESCRIPTION OF THE PREFERRED EMBODIMENTS

Embodiment 1

Figure 1:
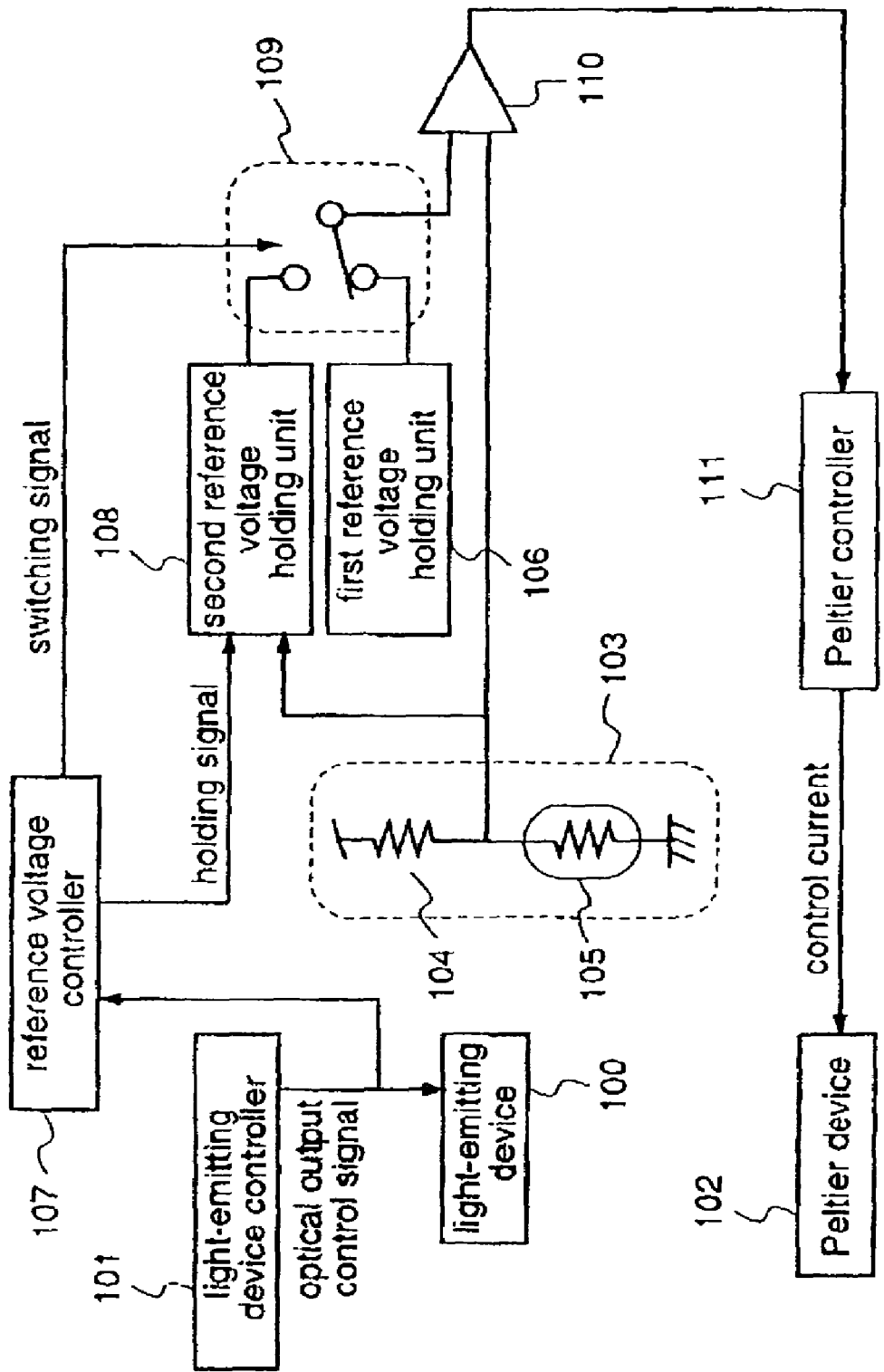
FIG. 1 is a block diagram illustrating the construction of a temperature control apparatus according to a first embodiment of the present invention.

FIG. 1 is a block diagram illustrating the construction of a temperature control apparatus according to a first embodiment of the present invention.

The temperature control apparatus shown in FIG. 1 comprises a light-emitting device 100; a light-emitting device controller 101 for outputting an optical output control signal for controlling an optical output from the light-emitting device 100; a heating/cooling unit (Peltier device) 102 for controlling the temperature of the light-emitting device 100 to a predetermined target temperature; a temperature detector 103 for detecting the temperature of the light-emitting device 100 and outputting a voltage corresponding to the result of detection; a first reference voltage holding unit 106 for holding an output voltage of the temperature detector 103 corresponding to the target temperature; a reference voltage controller 107 for generating a holding signal and a switching signal on the basis of the optical output control signal, and outputting these signals; a second reference voltage holding unit 108 for holding the output voltage of the temperature detector 103 on the basis of the holding signal; a reference voltage switching unit 109 for selecting the output voltage of the first reference voltage holding unit 106 as a reference voltage when the light-emitting device is quenched (quenching period), and selecting the output voltage of the second reference voltage holding unit 108 as a reference voltage when the light-emitting device emits light (light-emission period); a difference amplifier 110 for amplifying a difference between the output voltage of the temperature detector 103 and the output voltage of the reference voltage switching unit 109; and a Peltier controller 111 for controlling the Peltier device 102 according to the output of the difference amplifier 110.

The light-emitting device 100 is, for example, a semiconductor laser module in which plural beams of semiconductor laser light are collected using an optical fiber to obtain a high power optical output.

Further, the light-emitting device controller 101 outputs an optical output control signal for controlling the light-emitting intensity of the light-emitting device 100. The optical output control signal is a voltage value, and the light-emitting device 100 converts the voltage value into a current, and emits light by the driving current thus obtained.

Further, the difference amplifier 110 can be implemented by a differential amplifier circuit using an operational amplifier. The differential amplifier circuit is constructed so that the output voltage of the difference amplifier 110 has a positive voltage value when the output voltage of the temperature detector 103 is higher than the output voltage of the reference voltage switching unit 109 and, conversely, the output voltage of the difference amplifier 110 has a negative voltage value when the output voltage of the temperature detector 103 is lower than the output voltage of the reference voltage switching unit 109. When the difference between the output voltage of the reference voltage switching unit 109 and the output voltage of the temperature detector 103 is large, the output voltage of the difference amplifier 110 is restricted by the positive power supply or negative power supply of the operational amplifier. Accordingly, even a small temperature change can be amplified and converted into a voltage value by the difference amplifier 110, thereby realizing highly precise temperature detection.

Further, the Peltier controller 111 outputs a control current which makes the Peltier device 102 heat the light-emitting device 100 when the output voltage of the difference amplifier 110 is a positive voltage value. On the other hand, the Peltier controller ill outputs a control current which makes the Peltier device 102 cool the light-emitting device 100 when the output voltage of the difference amplifier 110 is a negative voltage value. The control current is increased with an increase in the absolute value of the output voltage of the difference amplifier 110 so that the output voltage of the difference amplifier 110 becomes zero.

Further, the temperature detector 103 comprises a resistor 104 and a thermistor 105 which are connected in series between the power supply and the ground.

The thermistor 105 is a device whose resistance value varies with variations in temperature. For example, when a thermistor having a B constant of 3380±1% and a resistance value of 10K±1% Ω at 25[° C.] and a resistor of 10KΩ are connected in series between a 5V power supply and the ground, the output voltage of the temperature detector 504 varies as shown in table 1. The output voltage becomes 2.5[V] at 25[° C.], and decreases by about 40 [mV] as the temperature increases by 1° C.

In order to set the temperature of the light-emitting device 100 to a desired target temperature, the first reference voltage holding unit 106 holds the output voltage of the temperature detector 103 corresponding to the target temperature as a reference voltage. This reference voltage is supplied as a fixed value from a system controller (not shown), or it is previously stored in the first reference voltage holding unit 106. For example, when the light-emitting device 100 is desired to be kept at 25[° C.], the output voltage of the temperature detector 103 should be kept at 2.5[V] as shown in table 1, and therefore, 2.5[V] is set on the first reference voltage holding unit 106.

The reference voltage controller 107 outputs a holding signal which makes the second reference voltage holding unit 108 hold the output voltage of the temperature detector 103 at a point in time when the grounding voltage of the temperature detector 103 increases, on the basis of the optical output control signal. Further, the reference voltage controller 107 outputs a switching signal for selecting either of the voltage set on the first reference voltage holding unit 106 and the voltage held by the second reference voltage holding unit 108, as a reference voltage for controlling the temperature of tho light-emitting device 100, between the light-emission period and quenching period of the light-emitting device 100. That is, it is detected from the optical output control signal that the light-emitting device 100 changes from the quenching state to the light-emitting state, or that it changes from the light-emitting state to the quenching state. When the light-emitting device 100 emits light, the holding signal instructs the second reference voltage holding unit 108 to hold the output voltage of the temperature detector 103, and immediately after that, the switching signal instructs the reference voltage switching unit 109 to select the output voltage of the second reference voltage holding unit 108 as a reference voltage. On the other hand, when the light-emitting device 100 is quenched, the switching signal instructs the reference voltage switching unit 109 to select the output voltage of the first reference voltage holding unit 106 as a reference voltage.

Thereby, even when the output voltage of the temperature detector 103 changes although the temperature of the light-emitting device 100 does nor change when the light-emitting device 100 emits light, there is no difference to be input to the difference amplifier 10 between the output voltage of the temperature detector 103 and the output voltage of the reference voltage switching unit 109, and therefore, the Peltier controller 111 does not perform unnecessary temperature control.

Figure 3:
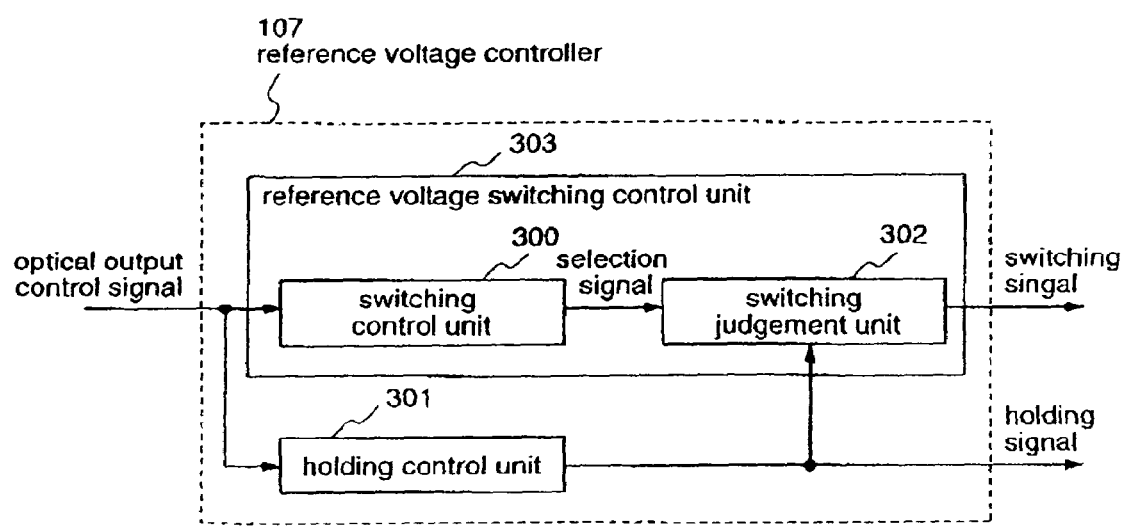
FIG. 3 is a block diagram illustrating the construction of a reference voltage controller of the temperature control apparatus according to the first embodiment.

The reference voltage controller 107 will be described in detail with reference to FIG. 3. FIG. 3 is a block diagram illustrating an example of the reference voltage controller 107. In FIG. 3, the reference voltage controller 107 comprises a holding control unit 301 and a reference voltage switching control unit 303. The reference voltage switching control unit 303 comprises a switching control unit 300 and a switching judgement unit 302.

The switching control unit 300 comprises, for example, an optical output control signal holding unit for holding the optical output control signal at predetermined time intervals; a state change detector for obtaining a difference between the output of the optical output control signal holding unit and the optical output control signal to detect a rising edge or a falling edge of the optical output control signal; a counter for counting a predetermined period of time; and a selection signal generation unit for changing the logic level of a selection signal when a predetermined period of time has passed from the detection of a rising edge or a falling edge of the optical output control signal. The selection signal generation unit sets the selection signal to a logic level at which the reference voltage switching unit 109 selects the output of the second reference voltage holding unit 108 when detecting a rising edge of the optical output control signal, and sets the selection signal to a logic level at which the reference voltage switching unit 109 selects the output of the first reference voltage holding unit 106 when detecting a falling edge of the optical output control signal. The above-mentioned predetermined time interval and predetermined period are determined with reference to the operation clock of the switching control unit 300. It is assumed that the predetermined time interval is 1 [msec] and the predetermined period is 5 [msec]. Thereby, the logic level of the selection signal can be changed before a temperature change of the light-emitting device 100 occurs (for example, a change of 0.5[° C.]) due to unnecessary temperature control by the Peltier controller 111 which is caused by that the ground voltage of the temperature detector 103 increases and thereby the output voltage changes even though the temperature of the light-emitting device 100 does not change when the light-emitting device 100 emits light. However, the above-mentioned operation of the switching control unit 300 enables switching of the logic level of the selection signal before such temperature change of the light-emitting device 100 occurs. A desired temperature control precision can be achieved by determining the above-mentioned predetermined time interval and predetermined period on the basis of the response time of the optical output control signal, the response time of the Peltier controller 111, and the thermal capacity of the light-emitting device 100.

The holding control unit 301 outputs a holding signal to the second reference voltage holding unit 108 and the switching judgement unit 302, on the basis of the optical output control signal. The holding signal is a pulse signal indicating the timing at which the second reference voltage holding unit 108 holds the output voltage of the temperature detector 103.

The holding control unit 301 comprises, for example, an optical output control signal holding unit for holding the optical output control signal at predetermined time intervals; a rising edge detection unit for obtaining a difference between the output of the optical output control signal holding unit and the optical output control signal to detect a rising edge of the optical output control signal; a counter for counting a predetermined period of time; and a holding signal generation unit for outputting a holding signal when a predetermined period of time has passed from when a rising edge of the optical output control signal is detected. The predetermined time interval and the predetermined period of time are determined on the basis of the operation clock of the holding control unit 301. It is assumed that the predetermined time interval is 1 [msec] and the predetermined period of time is 5 [msec]. Thereby, the holding signal generation unit can output a holding signal before the ground voltage of the temperature detector 103 increases when the light emitting device 100 emits light and thereby the output voltage changes to cause a temperature change (for example, a change of 0.5[° C.]) of the light-emitting device 100 due to unnecessary temperature control of the Peltier device 102.

A desired temperature control precision can be achieved by determining the predetermined time interval and the predetermined period of time on the basis of the response time of the optical output control signal, the response time of the Peltier control unit 111, and the thermal capacity of the light-emitting device 100.

The switching judgement unit 302 changes the logic level of a switching signal to be output to the reference voltage switching unit 109, on the basis of the selection signal outputted from the switching control unit 300 and the holding signal output from the holding control unit 301. The switching judgement unit 302 generates a holding completion signal to be initialized when the holding signal changes to a logic level indicating that holding of the output voltage of the temperature detector 103 is completed, and the selection signal changes to a logic level at which the output of the first reference voltage holding unit 106 is selected. When the selection signal outputted from the switching control unit 300 changes from the logic level for selecting the output of the first reference voltage holding unit 106 to the logic level for selecting the output of the second reference voltage holding unit 108 and further the holding completion signal is at the logic level indicating that holding of the output voltage of the temperature detector 103 is completed, the switching signal is changed to the logic level at which the reference voltage switching unit 109 selects the output voltage of the second reference voltage holding unit 108. Further, when the selection signal outputted from the switching control unit 300 changes from the logic level for selecting the output of the second reference voltage holding unit 108 to the logic level for selecting the output of the first reference voltage holding unit 106, the switching signal is changed to the logic level at which the reference voltage switching unit 109 selects the output voltage of the first reference voltage holding unit 106.

The switching control unit 300 may comprise an optical output control signal holding unit for holding the optical output control signal at predetermined time intervals; a state change detection unit for obtaining a difference between the output of the optical output control signal holding unit and the optical output control signal to detect a rising edge or a falling edge of the optical output control signal; a convergence judgement unit for judging whether the difference between the output of the optical output control signal holding unit and the optical output control signal becomes equal to or lower than a predetermined value after detecting a rising edge or a falling edge of the optical output control signal; and a selection signal generation unit for changing the logic level of the selection signal when the convergence judgement unit judges that there is a convergence.

Further, the switching control unit 300 may comprise an optical output control signal holding unit for holding the optical output control signal at predetermined time intervals; a state change detection unit for obtaining a difference between the output of the optical output control signal holding unit and the optical output control signal to detect a rising edge or a falling edge of the optical output control signal; a convergence judgement unit for judging whether the difference between the output of the optical output control signal holding unit and the optical output control signal becomes equal to or lower than a predetermined value after detecting a rising edge or a falling edge of the optical output control signal; a counter for counting a predetermined period of time; and a selection signal generation unit for changing the logic level of the selection signal when a predetermined period has passed after the convergence judgement unit judges that there is a convergence.

Further, the switching control unit 300 may comprise a comparison voltage generation unit for receiving a target value (not shown) of the optical output control signal during light emission from the light-emitting device controller 101, and multiplying the target value by a predetermined factor (for example 0.99 for rising, and 0.01 for falling), thereby generating a comparison voltage; a convergence judgement unit for judging whether the optical output control signal becomes larger than the comparison voltage at the time of rising while judging whether the optical output control signal becomes smaller than the comparison voltage at the time of falling; and a selection signal generation unit for changing the selection signal when the convergence judgement unit judges that there is a convergence.

Further, the holding control unit 301 may comprise an optical output control signal holding unit for holding the optical output control signal at predetermined time intervals; a rising detection unit for obtaining a difference between the output of the optical output control signal holding unit and the optical output control signal to detect a rising edge of the optical output control signal; a convergence judgement unit for judging whether the difference between the output of the optical output control signal holding unit and the optical output control signal becomes equal to or lower than a predetermined value after detecting a rising edge of the optical output control signal; and a holding signal generation unit for outputting a holding signal when the convergence judgement unit judges that there is a convergence.

Further, the holding control unit 301 may comprise an optical output control signal holding unit for holding the optical output control signal at predetermined time intervals; a rising edge detection unit for obtaining a difference between the output of the optical output control signal holding unit and the optical output control signal to detect a rising edge of the optical output control signal; a convergence judgement unit for judging whether the difference between the output of the optical output control signal holding unit and the optical output control signal becomes equal to or lower than a predetermined value after detecting a rising edge of the optical output control signal; a counter for counting a predetermined period of time; and a holding signal generation unit for outputting a holding signal when a predetermined period has passed after the convergence judgement unit judges that there is a convergence.

Furthermore, the holding control unit 301 may comprise a comparison reference generation unit for receiving a target value (not shown) of the optical output control signal during light emission from the light-emitting device controller 101, and multiplying the target value by a predetermined factor (for example, 0.99), thereby generating a comparison voltage; a convergence judgement unit for judging whether the optical output control signal becomes larger than the comparison voltage; and a holding signal generation unit for outputting a holding signal when the convergence judgement unit judges that there is a convergence.

The second reference voltage holding unit 108 holds the output voltage of the temperature detector 103 when detecting a pulse indicating holding of the holding signal, and continues to hold this output voltage until detecting a next pulse indicating holding of the holding signal. Then, the second reference voltage holding unit 108 outputs the held voltage value to the reference voltage switching unit 109.

Figure 2:
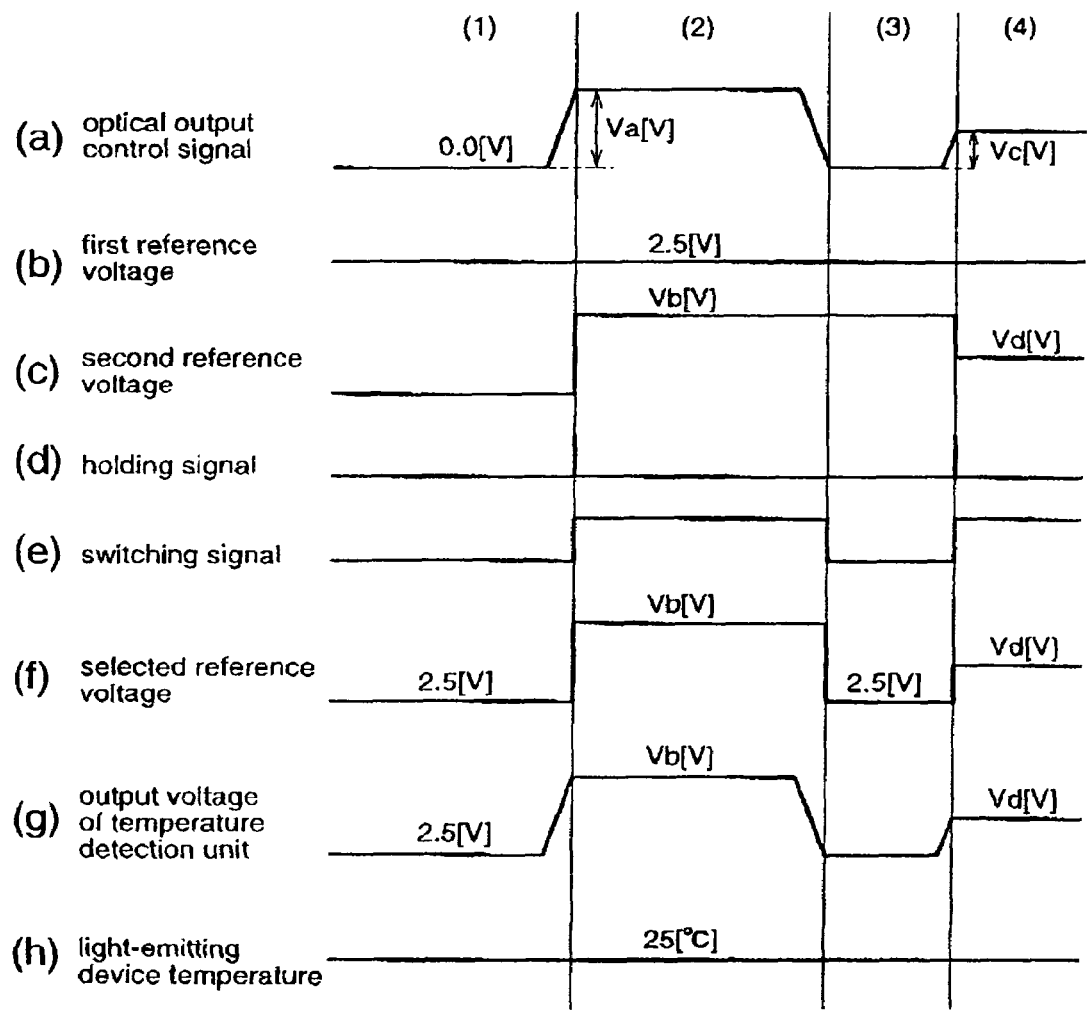
FIG. 2 is a diagram illustrating variations-with-time of plural signals in the temperature control apparatus according to the first embodiment.

The operation of the temperature control apparatus constructed as described above will be described in detail using FIG. 2. FIG. 2 shows variations-with-time of the respective signal levels when the light-emitting device 100 is controlled at 25[° C.], wherein the respective signal levels are varied in order of quenching period (1)→light-emission period (2)→quenching period (3)→light-emission period (4). It is assumed that the temperature detector 103 comprises a thermistor having a B constant of 3380±1% and a resistance value of 10K±1% Ω at 25[° C.], and a resistor of 10KΩ, which are connected in series between a 5V power supply and the ground In the quenching period (1), since the optical output control signal (a) outputted from the light-emitting device controller 101 has a signal level corresponding to "quenching" (e.g., 0[V]), the current value of the light-emitting device 100 is 0.0[A]. Further, since the target temperature is 25[° C.], the first reference voltage holding unit 106 holds the first reference voltage (b) of 2.5[V]. The switching signal (c) is outputted from the reference voltage control unit 107, and it has a logic level for selecting the first reference voltage. Accordingly, the selected reference voltage (f) is 2.5[V], whereby the output voltage (g) of the temperature detector is kept at 2.5[V]. That is, the light-emitting device temperature (h) is kept at 25[° C.].

Next, when the optical output control signal (a) corresponding to the light-emitting device 100 is Va=3.0[V] (when the operation shifts from the quenching period (1) to the light-emission period (2)), the ground voltage increases due to the current that flows in the light-emitting device 100, and the output voltage (g) of the temperature detector 103 also increases from 2.5[V] to Vb[V]. For example, when the ground voltage increases from 0[V] to 0.16[V], Vb=2.58[V].

At this time, the temperature of the light-emitting device 100 hardly changes. However, the Peltier control unit 111 judges that the temperature of the light-emitting device 100 decreases to 23[° C.] because the output voltage of the temperature detector 103 changes to 2.58[V], and controls the Peltier device 102 so as to start heating of the light-emitting device 100.

At this time, the second reference voltage holding unit 108 holds the second reference voltage (c) (Vb=2.58[V]) on the basis of the holding signal (d) outputted from the reference voltage control unit 107, and sets the switching signal (e) at the logic level for selecting the second reference voltage. Thereby, the selected reference voltage (f) and the output voltage (g) of the temperature detector, which are compared by the difference amplifier 110, become equal to each other, and therefore, the Peltier controller 111 does not perform temperature control to the Peltier device 102, and the Peltier device 102 does not heal the light-emitting device 100. Accordingly the light-emitting device temperature (h) is kept at 25[° C.].

Next, when the-current supplied to the light-emitting device 100 is interrupted to quench the light-emitting device (when the operation shifts from the light-emission period (2) to the quenching period (3)), the output voltage (g) of the temperature detector decreases to 2.5[V]. The reference voltage controller 107 sets the switching signal (e) at the logic level for selecting the first reference voltage (b). Thereby, the difference amplifier 110 compares the predetermined first reference voltage (b) with the output voltage of the temperature detector 103 having no voltage fluctuation, and therefore, the light-emitting device temperature (h) is kept at 25[° C.].

Further, when the optical output control signal (a) supplied to the light-emitting device 100 is set at Vc=1.5[V] which is different from that in the light-emission period (2) (when the operation shifts from the quenching period (3) to the light-emission period (4)), the output voltage (g) of the temperature detector increases from 2.5[V] to Vd[V]. For example, when the ground voltage increases from 0(V) to 0.08[V], Vd=2.54[V]. Even when the optical output from the light-emitting device 100 is thus changed, the Vd[V] as the second reference voltage (c) is held in like manner as in the case where the operation shifts from the quenching period (1) to the light-emission period (2), and the selected reference voltage (f) is changed to Vd[V], whereby the light-emitting device temperature (f) is kept at 25[° C.].

As described above, in the temperature control apparatus according to the first embodiment, when the light-emitting device controller 101 performs control to make the light-emitting device emit light, the output voltage of the temperature detector 103 immediately after the light emission is held by the second reference voltage holding unit 108, and the output voltage of the second reference voltage holding unit 108 is selected as a reference voltage for controlling the temperature of the light-emitting device 100 during the light-emission period of the light-emitting device 100, while the output voltage of the first reference voltage holding unit 106 is selected as a reference voltage for controlling the temperature of the light-emitting device 100 during the quenching period of the light-emitting device 100. Therefore, even when the light-emitting device emits light at an arbitrary output or is quenched, an appropriate reference voltage can be set and thereby the light-emitting device 100 can be kept at a target temperature.

While in this first embodiment the operation of the temperature control apparatus is described for the case where the ground voltage of the temperature detector 103 varies, even when the power supply voltage of the temperature detector 103 varies, variations in the output of the temperature detector 103 are similar to those in the case where the ground voltage varies. Therefore, even when the power supply voltage of the temperature detector 103 varies with light-emission or quenching of the light-emitting device, the same effects as described above can be achieved by the temperature control apparatus of the present invention.

Figure 4:
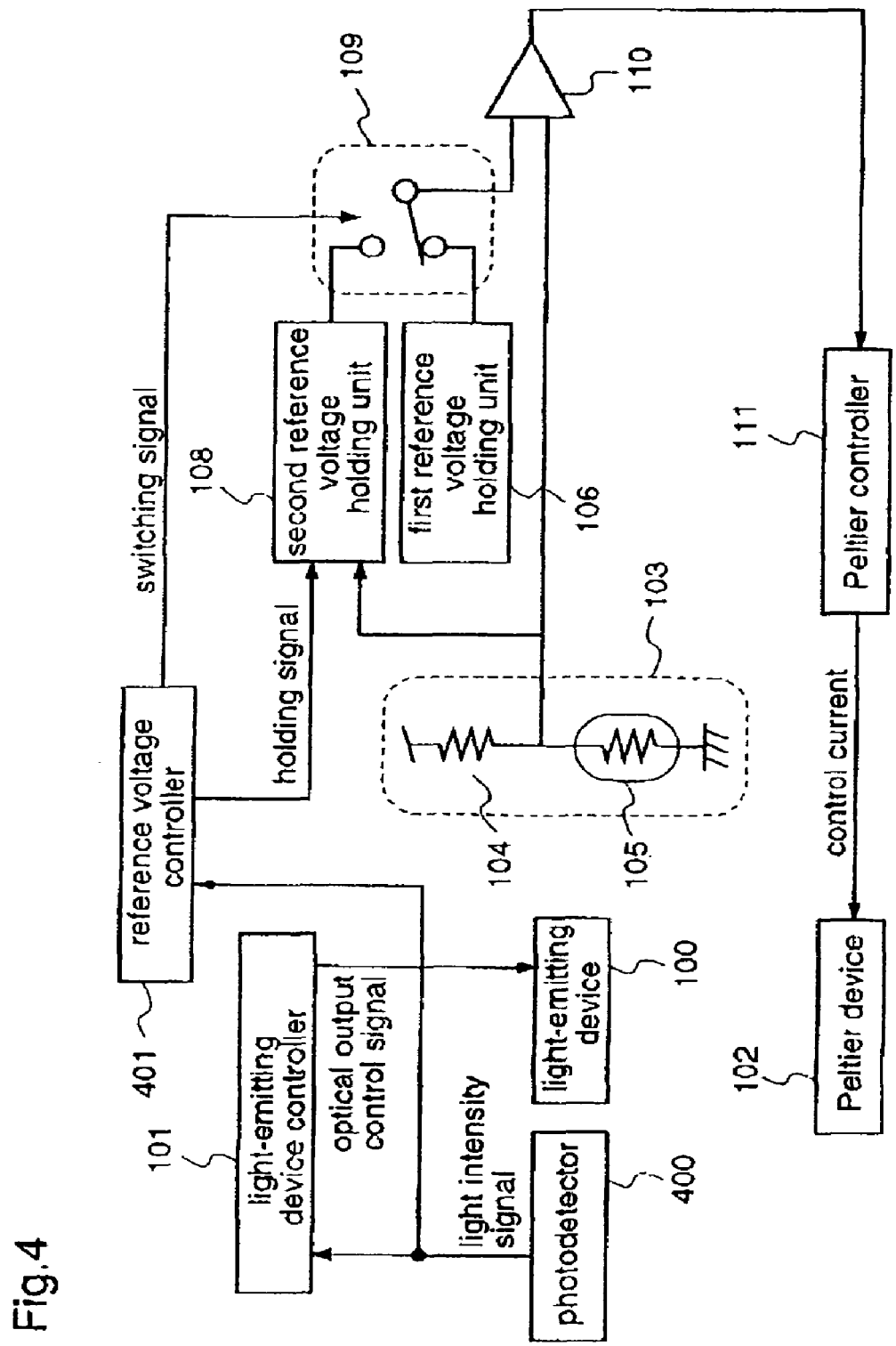
FIG. 4 is a block diagram illustrating the construction of a temperature control apparatus according to the present invention.
Figure 5:
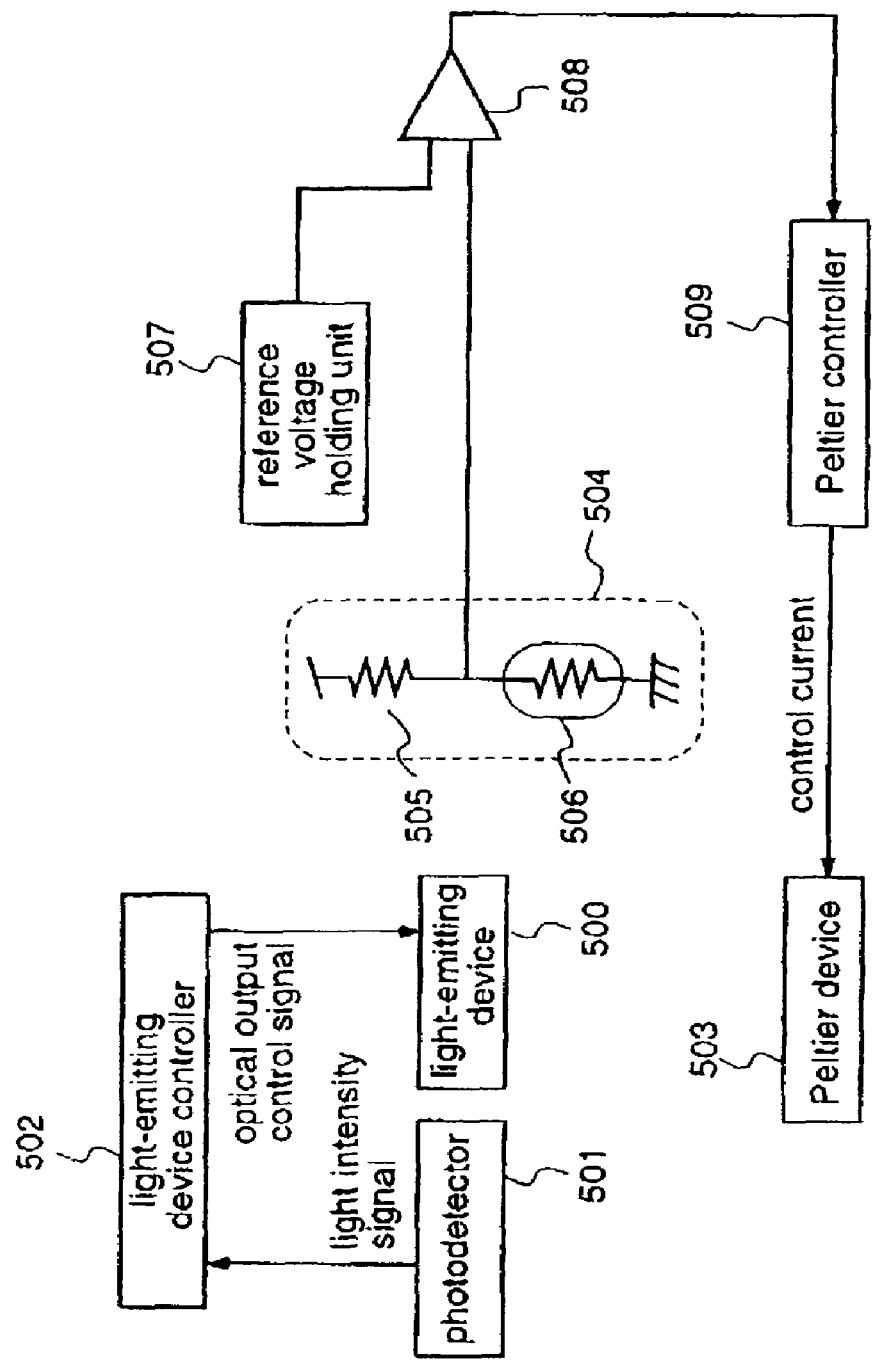
FIG. 5 is a block diagram illustrating the conventional temperature control apparatus.

Further, in this first embodiment, selection of a reference voltage and holding control of the reference voltage are carried out on the basis of the optical output control signal outputted from the light-emitting device controller 101. However, as shown in FIG. 4, a reference voltage controller 401 may perform selection of a reference voltage and holding control of the reference voltage on the basis of a light intensity signal outputted from a photodetector 400. In FIG. 4, the same reference numerals as those shown in FIG. 1 denote the same or corresponding parts.

In FIG. 4, the photodetector 400 detects the intensity of light emitted from the light-emitting device 100, and outputs a light intensity signal. If the light intensity signal has the same output characteristic as that of the optical output control signal shown in FIG. 2(a), the reference voltage controller 401 can be implemented by the same structure as the reference voltage controller 107 described with respect to FIG. 1.

While in this first embodiment a semiconductor laser is employed as the light-emitting device 100, the light-emitting device of the present invention is not restricted thereto. Any device may be employed so long as it can convert electric energy into optical energy, such as a light-emitting diode (LED), an incandescent lamp, or a halogen lamp.

Further, while in this first embodiment the Poltier device 102 is employed as a means for heating and cooling the light-emitting device 100, the heating/cooling means of the present invention is not restricted thereto. A heating/cooling means for circulating a liquid such as oil or water, or a vapor such as cooled gas may be employed to control the temperature of the light-emitting device.

While in this first embodiment the temperature detector 103 comprises a resistor and a thermistor, the temperature detector of the present invention is not restricted thereto Any temperature detector may be employed so long as it can convert temperature information into voltage information, such as a thermocouple.

APPLICABILITY IN INDUSTRY

The temperature control apparatus according to the present invention performs stable temperature control even when fluctuations occur in the power supply voltage or the ground voltage of the temperature detector when controlling the optical output of the light-emitting device. Therefore, the temperature control apparatus can stabilize the temperature of the light-emitting device, and it is suitable for a fluorescent microscope for observing fluorescence that is sensitive to wavelength of pumped light, a semiconductor exposure device that requires high processing precision, or an optical characteristic evaluation device that requires high detection precision.

What is claimed is:

1. A temperature control apparatus comprising:
    a light-emitting device;
    a light-emitting device controller for outputting an optical output control signal for controlling the optical output of the light-emitting device;
    a heating/cooling unit for controlling the temperature of the light-emitting device to a predetermined target temperature;
    a temperature detector for detecting the temperature of the light-emitting device, converting the result of detection into a voltage, and outputting the voltage;
    a first reference voltage holding unit for previously holding an output voltage of the temperature detector corresponding to the target temperature;
    a reference voltage controller for generating a holding signal and a switching signal on the basis of tho optical output control signal, and outputting these signals;
    a second reference voltage holding unit for holding the output voltage of the temperature detector on the basis of the holding signal;
    a reference voltage switching unit for selecting, on the basis of the switching signal, either the output voltage of the first reference voltage holding unit or the output voltage of the second reference voltage holding unit, and outputting the selected voltage as a reference voltage; and
    a heating/cooling controller for generating a control current the basis of a difference between the output voltage of the temperature detector and the reference voltage outputted from the reference voltage switching unit to control the heating/cooling unit;
    wherein said reference voltage controller controls the reference voltage switching unit with the switching signal to make the switching unit select the output voltage of the first reference voltage holding unit as the reference voltage when the light-emitting device is quenched, and controls the reference voltage switching unit with the switching signal to make the switching unit select the output voltage of the temperature detector which is held by the second reference voltage holding unit on the basis of the holding signal, as the reference voltage, when the light-emitting device emits light.

2. A temperature control apparatus as defined in claim 1 wherein said temperature detector comprises a resistor and a thermistor whose resistance value varies with temperature variations, which are connected in series between different two reference voltages, and the output voltage of the temperature detector varies as the resistance value of the thermistor varies.

3. A temperature control apparatus as defined in claim 1 wherein said holding signal is a signal for instructing the second reference voltage holding unit to hold the output voltage of the temperature detector when the light-emitting device changes from the quenching state to the light-emitting state.

4. A temperature control apparatus as defined in claim 1 wherein said switching signal is a signal for instructing the reference voltage switching unit to select the output voltage of the first reference voltage holding unit as the reference voltage while the light-emitting device is quenched, and select the output voltage of the second reference voltage holding unit as the reference voltage while the light-emitting device emits light.

5. A temperature control apparatus as defined in claim 1 wherein said reference voltage controller comprises:
   a holding control unit for judging whether the light-emitting device emits light or is quenched on the basis of the optical output control signal, and outputting the holding signal for making the second reference voltage holding unit hold the output voltage of the temperature detector when it is judged that the light-emitting device emits light; and
   a reference voltage switching control unit for judging whether the light-emitting device emits light or is quenched on the basis of the optical output control signal, and changes the logic level of the switching signal so as to make the reference voltage switching unit select the output voltage of the second reference voltage holding unit as the reference voltage when it is judged that the light-emitting device emits light and the holding control unit outputs the holding signal, and changes the logic level of the switching signal so as to make the reference voltage switching unit select the output voltage of the first reference voltage holding unit as the reference voltage when it is judged that the light-emitting device is quenched.

6. A temperature control apparatus as defined in claim 5 wherein said holding control unit judges that the light-emitting device emits light, when it detects a rising edge of the optical output control signal.

7. A temperature control apparatus as defined in claim 5 wherein said reference voltage switching control unit judges that the light-emitting-device emits light when it detects a rising edge of the optical output control signal, and judges that the light-emitting device is quenched when it detects a falling edge of the optical output control signal.

8. A temperature control apparatus comprising:
   a light-emitting device;
   a photodetector for outputting a light intensity signal indicating the light intensity of the light-emitting device;
   a light-emitting device controller for outputting an optical output control signal for controlling the optical output of the light-emitting device on the basis of the light intensity signal;
   a heating/cooling unit for controlling the temperature of the light-emitting device to a predetermined target temperature;
   a temperature detector for detecting the temperature of the light-emitting device, converting the result of detection into a voltage, and outputting the voltage;
   a first reference voltage holding unit for previously holding an output voltage of the temperature detector corresponding to the target temperature;
   a reference voltage controller for generating a holding signal and a switching signal on the basis of the light intensity signal, and outputting these signals;
   a second reference voltage holding unit for holding the output voltage of the temperature detector on the basis of the holding signal;
   a reference voltage switching unit for selecting, on the basis of the switching signal, either the output voltage of the first reference voltage holding unit or the output voltage of the second reference voltage holding unit, and outputting the selected voltage as a reference voltage; and
   a heating/cooling controller for generating a control current on the basis of a difference between the output voltage of the temperature detector and the reference voltage outputted from the reference voltage switching unit to control the heating/cooling unit;
   wherein said reference voltage controller controls the reference voltage switching unit with the switching signal to make the switching unit select the output voltage of the first reference voltage holding unit as the reference voltage when the light-emitting device is quenched, and controls the reference voltage switching unit with the switching signal to make the switching unit select the output voltage of the temperature detector which is held by the second reference voltage holding unit on the basis of the holding signal, as the reference voltage, when the light-emitting device emits light.

9. A temperature control apparatus as defined in claim 8 wherein said temperature detector comprises a resistor and a thermistor whose resistance value varies with temperature variations, which are connected in series between different two reference voltages, and the output voltage of the temperature detector varies as the resistance value of the thermistor varies.

10. A temperature control apparatus as defined in claim 8 wherein said holding signal is a signal for instructing the second reference voltage holding unit to hold the output voltage of the temperature detector when the light-emitting device changes from the quenching state to the light-emitting state.

11. A temperature control apparatus as defined in claim 8 wherein said switching signal is a signal for instructing the reference voltage switching unit to select the output voltage of the first reference voltage holding unit as the reference voltage while the light-emitting device is quenched, and select the output voltage of the second reference voltage holding unit as the reference voltage while the light-emitting device emits light.

12. A temperature control apparatus as defined in claim 8 wherein said reference voltage controller comprises;
   a holding control unit for judging whether the light-emitting device emits light or is quenched on the basis of the light intensity signal, and outputting a holding signal for making the second reference voltage holding unit hold the output voltage of the temperature detector when it is judged that the light-emitting device emits light; and
   a reference voltage switching control unit for judging whether the light-emitting device emits light or is quenched on the basis of the light intensity signal, and changes the logic level of the switching signal so as to make the reference voltage switching unit select the output voltage of the second reference voltage holding unit as the reference voltage when it is judged that the light-emitting device emits light and the holding control unit outputs the holding signal, and changes the logic level of the switching signal so as to make the reference voltage switching unit select the output voltage of the first reference voltage holding unit as the reference voltage when it is judged that the light-emitting device is quenched.

13. A temperature control apparatus as defined in claim 12 wherein said holding control unit judges that the light-emitting device emits light, when it detects a rising edge of the light intensity signal.

14. A temperature control apparatus as defined in claim 12 wherein said reference voltage switching control unit judges that the light-emitting device emits light when it detects a rising edge of the light intensity signal, and judges that the light-emitting device is quenched when it detects a falling edge of the light intensity signal.

* * * * *